United States Patent [19]
Oh

[11] Patent Number: 6,130,138
[45] Date of Patent: *Oct. 10, 2000

[54] METHODS OF FORMING INTEGRATED CIRCUIT CAPACITORS HAVING DOPED DIELECTRIC REGIONS THEREIN

[75] Inventor: Hee-Seon Oh, Kyungdi-do, Rep. of Korea

[73] Assignee: Samsung Electronics Co., Ltd., Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/947,948

[22] Filed: Oct. 9, 1997

[30] Foreign Application Priority Data

Oct. 14, 1996 [KR] Rep. of Korea ............... 96-45702

[51] Int. Cl.[7] ............................................... H02L 21/70
[52] U.S. Cl. .................... 438/393; 438/382; 438/385; 438/394; 438/396
[58] Field of Search ............................... 438/382, 384, 438/385, 240, 396, 381, 393, 394, 201, 211, 257, 593; 257/296, 300, 303, 307, 239, 261, 314, 315

[56] References Cited

U.S. PATENT DOCUMENTS

| | | | |
|---|---|---|---|
| 4,577,390 | 3/1986 | Haken | 438/396 |
| 4,653,176 | 3/1987 | Van Ommen | 438/385 |
| 4,682,402 | 7/1987 | Yamaguchi | 438/384 |
| 5,250,456 | 10/1993 | Bryant | 438/394 |
| 5,356,826 | 10/1994 | Natsume | 438/394 |
| 5,420,053 | 5/1995 | Miyazaki | 438/384 |
| 5,434,098 | 7/1995 | Chang | 438/240 |
| 5,489,547 | 2/1996 | Erdeljac et al. | 438/238 |
| 5,597,759 | 1/1997 | Yoshimori | 438/384 |
| 5,686,338 | 11/1997 | Liu | 438/396 |
| 5,795,794 | 8/1998 | Nagano et al. | 438/240 |
| 5,908,311 | 6/1999 | Chi et al. | 438/258 |
| 5,953,599 | 9/1999 | El-Diwany | 438/258 |

*Primary Examiner*—Donald L. Monin, Jr.
*Assistant Examiner*—Michael Dietrich
*Attorney, Agent, or Firm*—Myers Bigel Sibley & Sajovec

[57] ABSTRACT

A method of making a semiconductor device having a thin film resistor, the method comprising the steps of: forming a first polysilicon layer on an upper surface of a field oxide layer formed on a semiconductor substrate; forming a first dielectric layer on a resultant material; ion-implanting an impurity for forming a resistor in the first polysilicon layer through the first dielectric layer; forming a second dielectric layer on an upper surface of the first dielectric layer; selectively etching the first and second dielectric layers and the first polysilicon layer to form a resistor poly (RPOLY) lower electrode; forming a second polysilicon layer on an upper surface of a resultant material; and forming a gate poly (GPOLY) by selectively etching the second polysilicon layer.

13 Claims, 7 Drawing Sheets

31 (Grain boundary)

METHODS OF FORMING INTEGRATED CIRCUIT CAPACITORS HAVING DOPED DIELECTRIC REGIONS THEREIN

FIELD OF THE INVENTION

The present invention relates to methods of forming semiconductor devices, and more particularly to methods of forming semiconductor devices having thin-film resistors therein.

BACKGROUND OF THE INVENTION

In an analog process among manufacturing processes of semiconductor devices, a polysilicon layer is typically formed in duplicate to implement an independent thin film capacitor with respect to a bias. Specifically, such a double polysilicon layer is composed of an upper layer which is named a gate poly (hereinafter referred to as "GPOLY") and is used as a gate electrode, and a lower layer which is named a resistor poly (RPOLY) and is used as a lower capacitor electrode or a poly resistor.

According to the thin film capacitor produced by a conventional method, however, the uniformity of resistance per lot, wafer, is and region of the same wafer is widely distributed, causing the product inferiority as well as the increase of the number of processes.

FIGS. 2 to 9 are sectional views explaining conventional processes for making a capacitor having a thin film resistor, as illustrated by FIG. 1. As shown in FIG. 2, polysilicon is deposited on the upper surface of a silicon substrate 10, on which a typical field oxide layer 20 is separately formed as a capacitor region and a resistor region to form a first polysilicon layer 30, and then a buffer oxide layer 22 is thermally grown thereon as shown in FIG. 3.

Thereafter, an impurity ion implantation step is performed with respect to the first polysilicon layer 30 through the buffer oxide layer 22 as shown in FIG. 4, and then the buffer oxide layer 22 is removed on the whole by etching, as illustrated by FIG. 5. Thereafter, a bottom oxide layer 24 is thermally grown on the upper surface of the first polysilicon layer 30 as shown in FIG. 6, and then a silicon nitride layer 40 is formed on the upper surface of the bottom oxide layer 24 as shown in FIG. 7.

Next, as shown in FIGS. 7 and 8, a pattern of photoresist 70 for forming a capacitor and a resistor is formed on the silicon nitride layer 40, and then the silicon nitride layer 40, the bottom oxide layer 24, and the first polysilicon layer 30 are etched using an etching mask so that the substrate is exposed to form the RPOLY. A second polysilicon layer 35 is formed by deposition on the upper surface of the resultant material. Thereafter, as shown in FIG. 9, a photoresist (not shown) pattern is formed on the resultant material, and then the second polysilicon layer 35 is etched using the photoresist as an etching mask so as to form the GPOLY.

However, in the conventional method of making a thin film capacitor, oxidation of a grain boundary 31 is severely occurred when forming the buffer oxide layer 22 (see FIG. 10). Also, when removing the buffer oxide layer 22 by etching after ion-implantation process is performed with respect to the first polysilicon layer 30 which is arranged in the lower part, a pit formed in the grain boundary 31 is grew bigger (see FIG. 11), and thereby the impurity implanted into the first polysilicon layer 30 when forming the bottom oxide layer 24 is non-uniformly lost (see FIG. 12). Accordingly, the resistance distribution of the RPOLY deteriorates, and the quality of the bottom oxide layer 24 is lowered because the bottom oxidation is advanced along the pit. As a result, since the first polysilicon layer 30, that is, the POLY is used as a bottom electrode of the PIP (polysilicon-insulator-polysilicon) capacitor, non-uniformity of the resistance distribution can deteriorate properties of the capacitor.

SUMMARY OF THE INVENTION

It is an object of the present invention to solve the problems involved in the prior art, and to provide a method of making a semiconductor device having a thin film resistor which can improve the process stability and the number of processes, and thus shorten the manufacturing processes by reducing the resistance distribution of the POLY.

In order to achieve the above object, there is provided a method of making a semiconductor device having a thin film resistor, the method comprising the steps of: forming a first polysilicon layer on an upper surface of a field oxide layer formed on a semiconductor substrate; forming a first dielectric layer on a resultant material; ion-implanting an impurity for forming a resistor in the first polysilicon layer through the first dielectric layer; forming a second dielectric layer on an upper surface of the first dielectric layer; selectively etching the dielectric layers and the first polysilicon layer to form a resistor poly (RPOLY); forming a second polysilicon layer on an upper surface of a resultant material; and forming a gate poly (GPOLY) by selectively etching the second polysilicon layer.

According to another aspect of the present invention, the PIP (polysilicon-insulator-polysilicon) capacitor of the present invention can further include a third dielectric layer deposited onto the second dielectric layer.

BRIEF DESCRIPTION OF THE DRAWINGS

The above object, and other features and advantages of the present invention will become more apparent by describing the preferred embodiment thereof with reference to the accompanying drawings, in which.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. Like numbers refer to like elements throughout.

Figure 13:
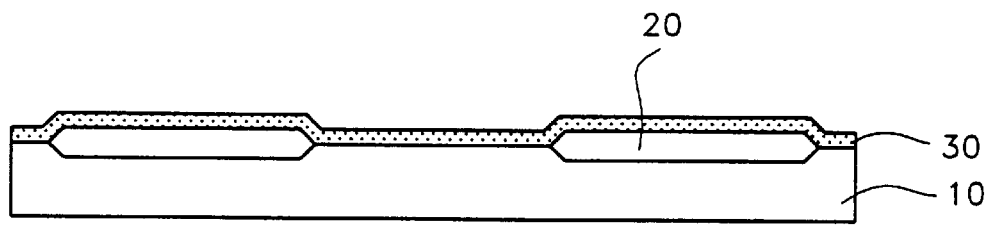
FIGS. 13 to 18 are sectional views for illustrating the processes of manufacturing the capacitor of FIG. 1 according to the present invention.
Figure 14:
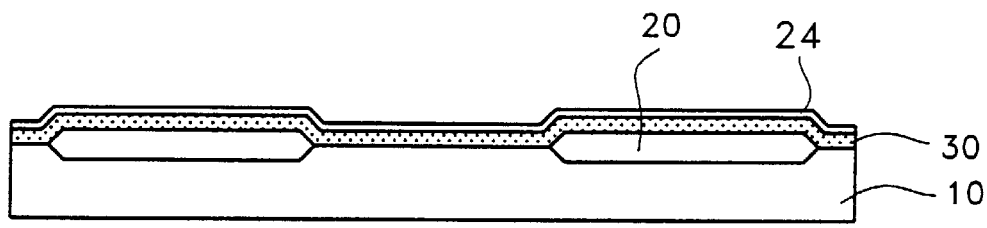

FIGS. 13 to 18 are sectional views explaining the processes for making a capacitor having a thin film resistor according to the present invention. First, a field oxide layer 20 for forming a capacitor and a resistor is formed on a silicon substrate 10, a first polysilicon layer 30 is formed on the upper surface of the substrate 10 to a thickness of 2000±200 Å by deposition as shown in FIG. 13, and then a bottom oxide layer 24 as a first dielectric layer is thermally grown thereon with a thickness of about 60–80 Å as shown in FIG. 14.

Figure 15:
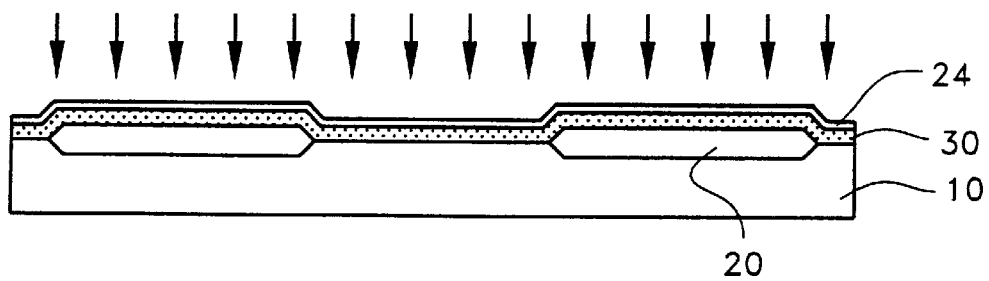
Figure 16:
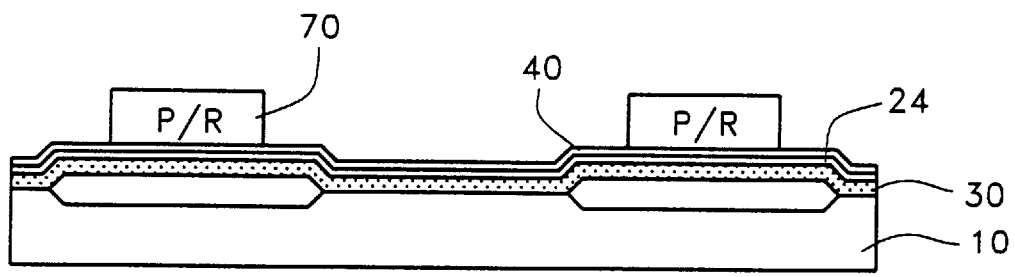

Thereafter, as shown in FIG. 15, an impurity ion implantation is performed with respect to the first polysilicon layer 30 at $75AS^{+, 70}$ KeV and 2.0E15, and then a silicon nitride layer 40 as a second dielectric layer is deposited on an upper surface of a resultant material with a thickness of about 200–250 Å as shown in FIG. 16. A pattern of photoresist 70 for forming the capacitor and the resistor is formed on the silicon nitride layer 40.

Figure 17:
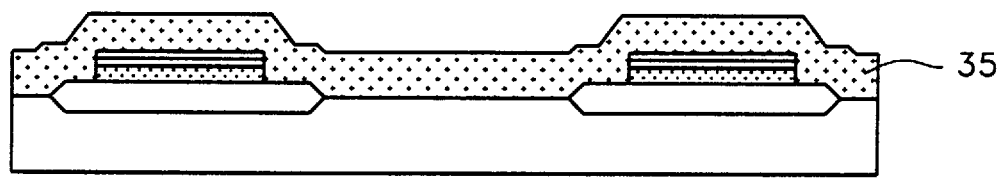

Thereafter, as shown in FIG. 17, the silicon nitride layer 40, the bottom oxide layer 24, and the first polysilicon layer 30 are selectively etched using the photoresist pattern 70 as an etching mask so as to form the RPOLY, the photoresist 70 is removed, and then a second polysilicon layer 35 is formed by deposition on an upper surface of a resultant material.

Figure 18:
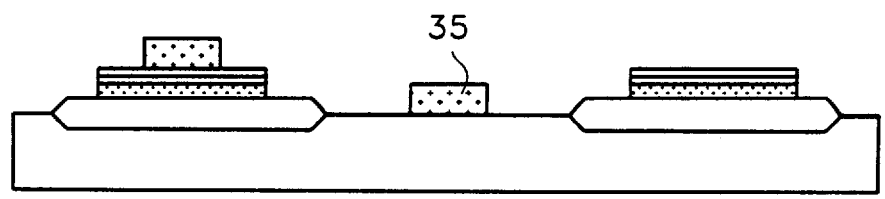

Next, as shown in FIG. 18, a photoresist pattern (not illustrated) is formed on the a resultant material, and then the second polysilicon layer 35 is selectively etched using the photoresist pattern as an etching mask, to form an upper electrode of the capacitor. At this time, the upper electrode is simultaneously used as a gate polysilicon of a transistor.

Figure 1:
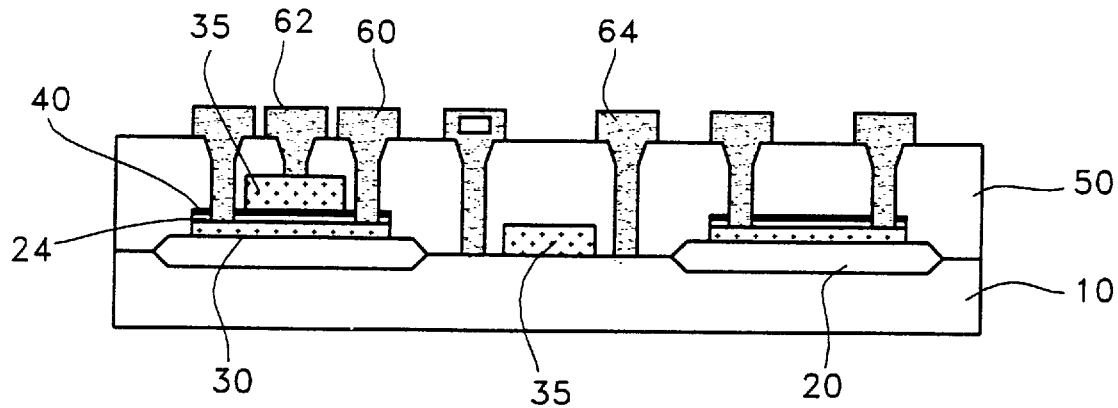
FIG. 1 is a sectional view of a capacitor having a thin film resistor.
Figure 2:
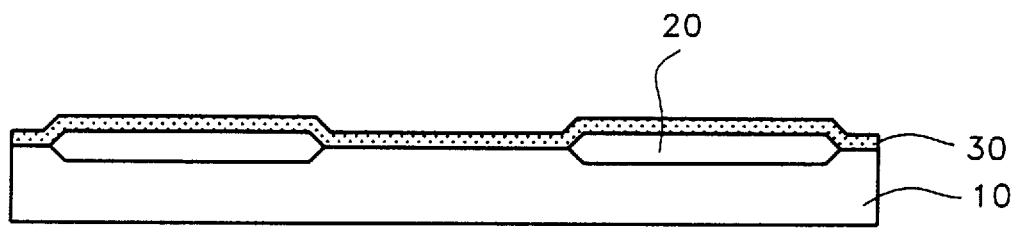
FIGS. 2 to 9 are sectional views explaining conventional processes for making the capacitor of FIG. 1.

Thereafter, as illustrated best by FIG. 1, the photoresist is removed, an insulating layer 50 is deposited on a resultant material, and then a contact hole is formed by a conventional method. Finally, respective electrodes 60, 62 and 64 are formed by depositing a metal and then etching it, so that a capacitor having a thin film resistor is completed.

According to the method of making a capacitor having a thin film resistor according to the present invention as described above, the conventional processes for removing the buffer oxide layer 22 by etching and then forming the bottom oxide layer 24 on the resultant material can be omitted by using the buffer oxide layer 22 formed on the first polysilicon layer 30 as the bottom oxide layer 24. Accordingly, a pit formed due to grain boundary oxidation occurred when forming the buffer oxide layer 22 can not be further grew, and thereby a extent to which the doped impurity ion is lost can be maintained to a small value.

Figure 3:
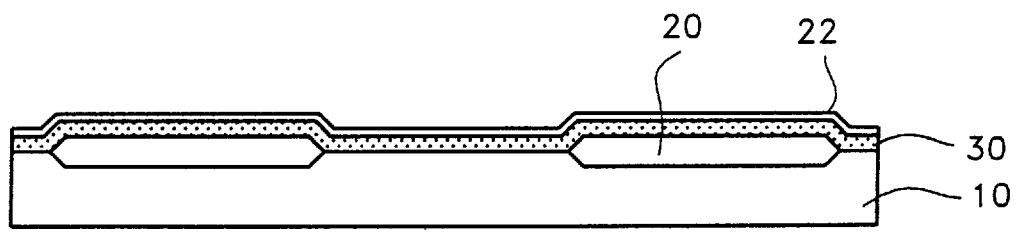
Figure 4:
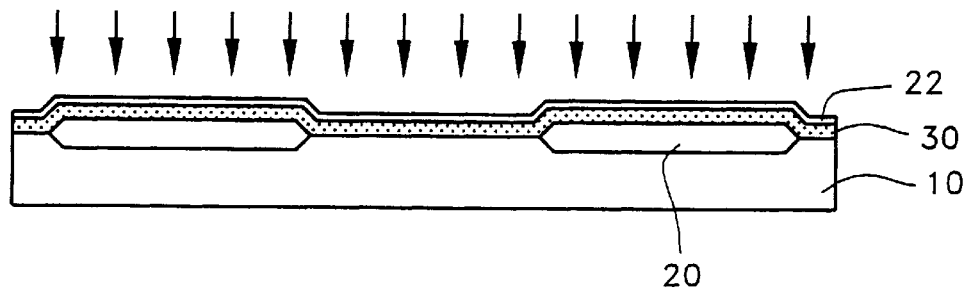
Figure 5:
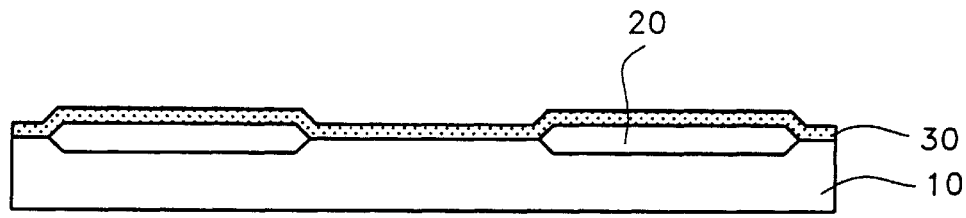
Figure 6:
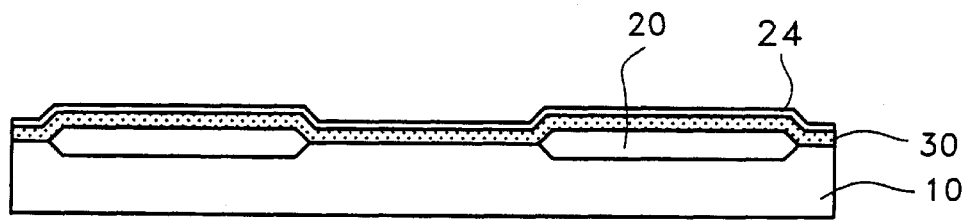
Figure 7:
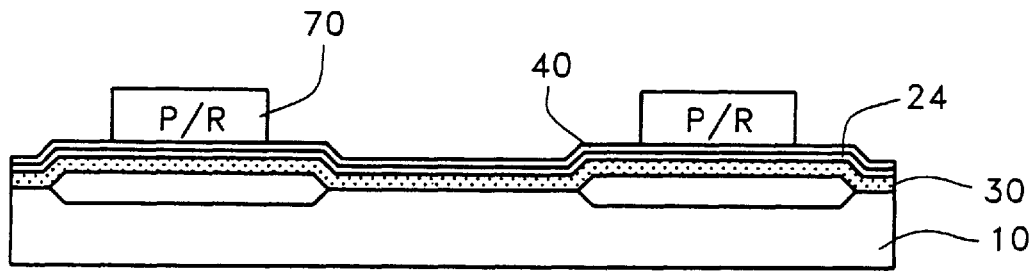
Figure 8:
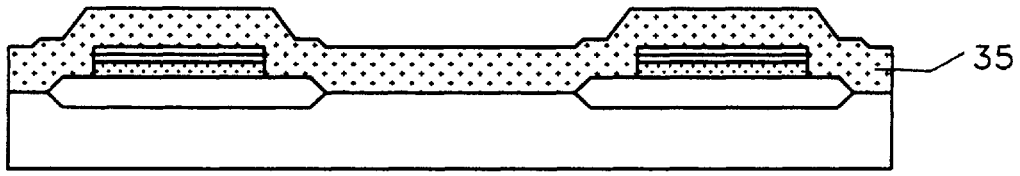
Figure 9:
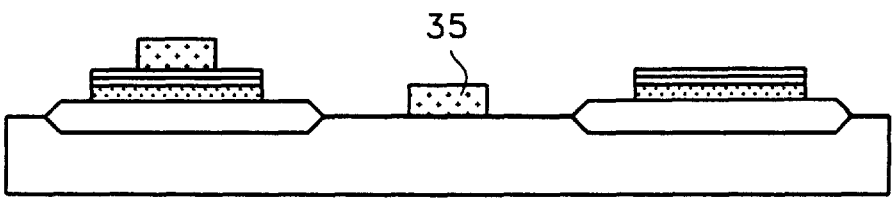
Figure 10:
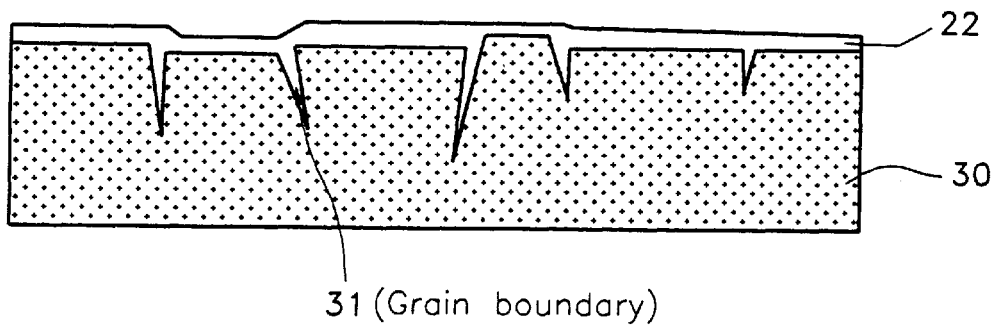
FIGS. 10 to 12 are sectional views for illustrating a defect developed in the process of manufacturing the capacitor of FIG. 1, according to the prior art.
Figure 11:
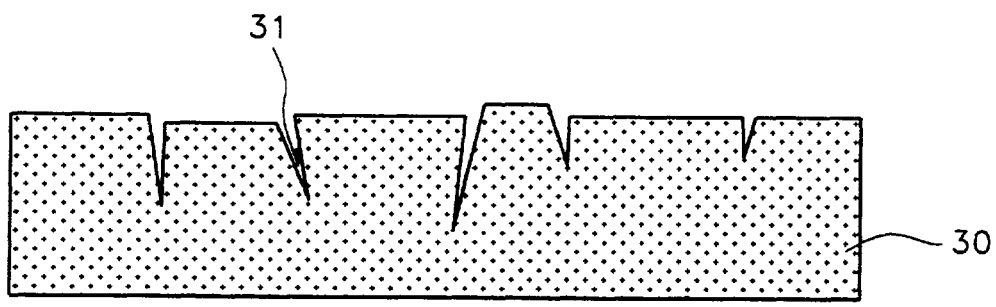
Figure 12:
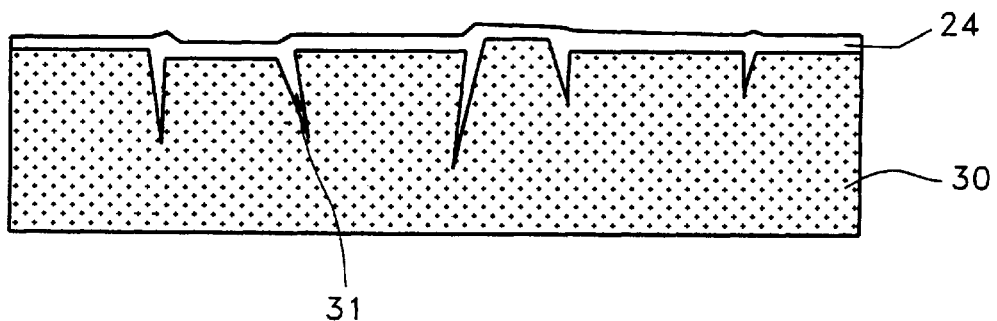

Specifically, according to the present invention, the processes as shown in FIGS. 3 and 5 among the conventional processes for making a thin film capacitor as shown in FIGS. 2 to 9 can be omitted, so that the number of processes as well as the resistance distribution of the RPOLY can be greatly reduced.

Figure 19:
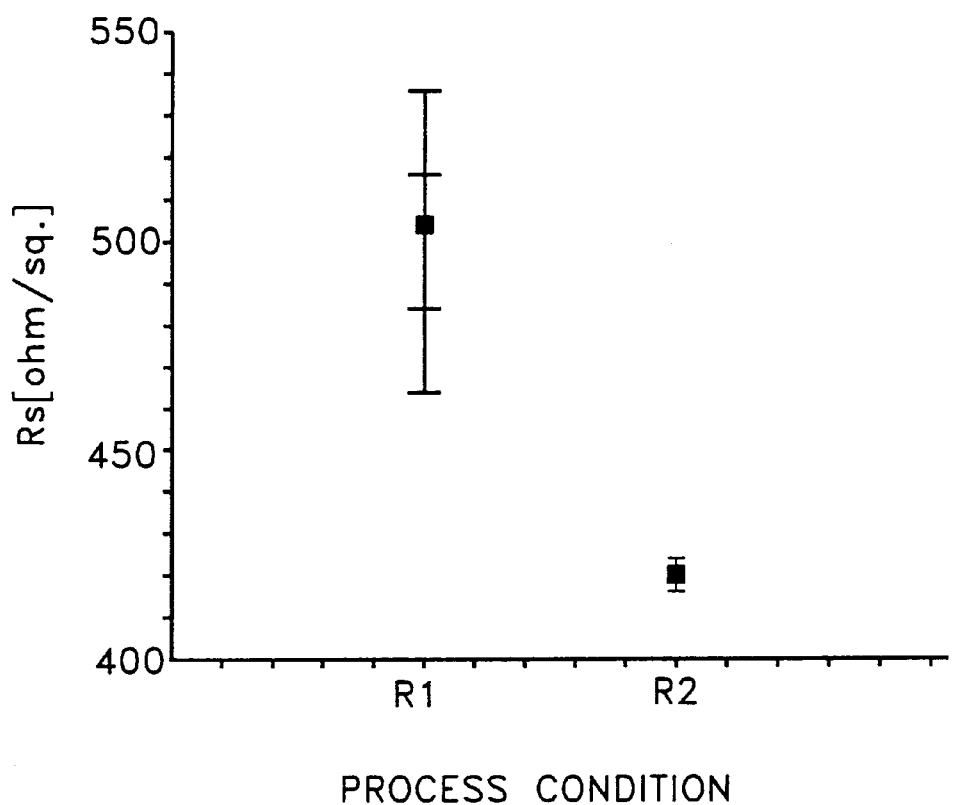
FIG. 19 is a graph showing the resistance distribution of the POLY of the capacitor produced according to the present invention in comparison with that produced by a conventional method.

Practically, the resistance distribution with respect to the RPOLY of the capacitor manufactured according to the present invention has been measured. According to the measurement, the resistance distribution according to the present invention has been confirmed to be greatly reduced in comparison with that of the RPOLY of the capacitor manufactured by a conventional method. FIG. 19 is a graph showing the comparison result, wherein R1 denotes the resistance distribution of the RPOLY according to the conventional method, and R2 denotes the resistance distribution of the RPOLY according to the present invention. In the graph, the RPOLY according to the conventional method reveals a wide resistance distribution and a relatively high resistance per unit area as a whole, while the RPOLY according to the present invention reveals a narrow resistance distribution and a relatively low resistance per unit area as a whole. At this time, the resistance value can be adjusted by an amount of ion-implantation.

As described above, according to the present invention, the process stability and the number of processes for making a semiconductor device can be improved by greatly reducing the resistance distribution of the RPOLY.

Further, the processes for etching the buffer oxide layer and growing the bottom oxide layer can be omitted by using the buffer oxide layer as the bottom oxide layer, resulting in that change in electrical characteristics of the digital parts affected by the analog process can be inhibited as well as the manufacturing processes can be simplified and shortened.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming an integrated circuit capacitor, comprising the steps of:

forming a semiconductor layer on a substrate;

forming a first dielectric layer on the semiconductor layer;

implanting either donor or acceptor dopants for a first conductivity type through the first dielectric layer and into the semiconductor layer; then patterning the semiconductor layer and the first dielectric layer to define a first capacitor electrode and a capacitor dielectric layer containing implanted dopants of first conductivity type therein, respectively; and forming a second capacitor electrode on the capacitor dielectric layer, opposite the first capacitor electrode.

2. The method of claim 1, wherein said implanting step comprises implanting arsenic ions into the first dielectric layer at an energy of 70 KeV and at a dose level of $2\times10^{15}$ cm$^{-2}$.

3. The method of claim 1, wherein said step of forming a second capacitor electrode comprises depositing a layer of polysilicon on the capacitor dielectric layer.

4. The method of claim 1, wherein the semiconductor layer comp rises polysilicon.

5. The method of claim 1, wherein said implanting step is followed by the step of forming a silicon nitride layer on the first dielectric layer, opposite the first semiconductor layer; and wherein said patterning step comprises patterning the silicon nitride layer and the first dielectric layer in sequence as the capacitor dielectric layer.

6. The method of claim 5, wherein said implanting step comprises implanting arsenic ions into the first dielectric layer at an energy of 70 KeV and at a dose level of $2\times10^{15}$ cm$^{-2}$.

7. The method of claim 5, wherein said step of forming a second capacitor electrode comprises depositing a layer of polysilicon on the patterned silicon nitride layer.

8. A method of forming an integrated circuit device, comprising the steps of:

forming a semiconductor layer on a substrate;

forming a first dielectric layer on the semiconductor layer;

implanting either donor or acceptor dopants for a first conductivity type through the first dielectric layer and into the semiconductor layer; then selectively etching the first semiconductor layer and the first dielectric layer to define a lower capacitor electrode, a capacitor dielectric layer having the implanted dopants therein on the lower capacitor electrode and a resistor having the implanted dopants therein; and then forming a second capacitor electrode on the capacitor dielectric layer, opposite the first capacitor electrode.

9. The method of claim 8, wherein said implanting step comprises implanting arsenic ions into the first dielectric layer at an energy of 70 KeV and at a dose level of $2 \times 10^{15}$ cm$^{-2}$.

10. The method of claim 8, wherein said step of forming a second capacitor electrode comprises depositing a layer of polysilicon on the capacitor dielectric layer.

11. The method of claim 8, wherein said step of forming a second capacitor electrode comprises depositing a layer of polysilicon on the capacitor dielectric layer and on the resistor; and wherein said step of depositing a layer of polysilicon is followed by the step removing the layer of polysilicon from the resistor.

12. The method of claim 8, wherein said implanting step is followed by the step of forming a silicon nitride layer on the first dielectric layer, opposite the first semiconductor layer; and wherein said patterning step comprises patterning the silicon nitride layer and the first dielectric layer in sequence to define the capacitor dielectric layer.

13. The method of claim 12, wherein said implanting step comprises implanting arsenic ions into the first dielectric layer at an energy of 70 KeV and at a dose level of $2 \times 10^{15}$ cm$^{-2}$.

* * * * *